(12) United States Patent
Wright

(10) Patent No.: US 8,462,121 B1
(45) Date of Patent: Jun. 11, 2013

(54) CIRCUIT FOR READING BUTTONS AND CONTROLLING LIGHT EMITTING DIODES

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 157 days.

(21) Appl. No.: 13/032,640

(22) Filed: Feb. 22, 2011

Related U.S. Application Data

(63) Continuation of application No. 11/616,779, filed on Dec. 27, 2006, now Pat. No. 7,893,925.

(60) Provisional application No. 60/754,489, filed on Dec. 27, 2005.

(51) Int. Cl.
*G06F 3/02* (2006.01)

(52) U.S. Cl.
USPC .......................... 345/170; 345/156; 345/519

(58) Field of Classification Search
USPC ............... 345/168, 169, 170, 172, 156; 315/7
See application file for complete search history.

(56) References Cited

U.S. PATENT DOCUMENTS

| | | | |
|---|---|---|---|
| 5,338,991 A * | 8/1994 | Lu | 327/455 |
| 5,523,554 A | 6/1996 | Hassler et al. | |
| 5,912,578 A * | 6/1999 | Bird | 327/407 |
| 6,417,787 B1 | 7/2002 | Hsu | |
| 6,693,550 B1 | 2/2004 | Heiler et al. | |
| 7,053,560 B1 | 5/2006 | Ng | |
| 7,175,302 B2 | 2/2007 | Kazar | |
| 7,557,782 B2 | 7/2009 | Anthony et al. | |
| 7,724,218 B2 | 5/2010 | Kim et al. | |
| 7,738,001 B2 | 6/2010 | Routley et al. | |
| 2001/0013860 A1 | 8/2001 | Gancarcik | |
| 2005/0122718 A1 | 6/2005 | Kazar et al. | |

OTHER PUBLICATIONS

USPTO Notice of Allowance for U.S. Appl. No. 11/616,779 dated Jul. 1, 2010; 7 pages.
USPTO Non-Final Rejection for U.S. Appl. No. 11/616,779 dated Jan. 22, 2010; 6 pages.
USPTO Requirement Restriction for U.S. Appl. No. 11/616,779 dated Oct. 27, 2009; 6 pages.
Schumacher, Richard "Easy Block detection and 2-Color Signals, Part 3: 2-Color Signals". Presented at Long Beach NMRA National Convention; copyright 2006 downloaded on May 23, 2011, Gateway Division NMRA http://www.gatewaynmra.org/detection1.htm; 13 pages.
Richard Schumacher. "Easy Block Detection and 2-Color Signals. Part 3: 2-Color Signals," Presented at Long Beach NMRA National Convention, 2006, Gateway Division NMRA, http://www.gatewaynmra.org/detection1.htm.
USPTO Non-Final Rejection for U.S. Appl. No. 11/616,779 dated Jan. 22, 2010: 6 pages.
USPTO Notice of Allowance for U.S. Appl. No. 11/616,779 dated Oct. 14, 2010; 6 pages.

* cited by examiner

*Primary Examiner* — Douglas W Owens
*Assistant Examiner* — Jianzi Chen

(57) ABSTRACT

A circuit including a first pin connection, a second pin connection, a first diode-switch arrangement and a second diode-switch arrangement. The first diode-switch arrangement is connected in series and configured to allow a current to pass from the second pin connection to the first pin connection. The second diode-switch arrangement is connected in series and configured to allow a current to pass from the first pin connection to the second pin connection. An energized state of the first and second diode-switch arrangements is determined according to a voltage detected on the first or second pin connection.

12 Claims, 7 Drawing Sheets

FIG. 4
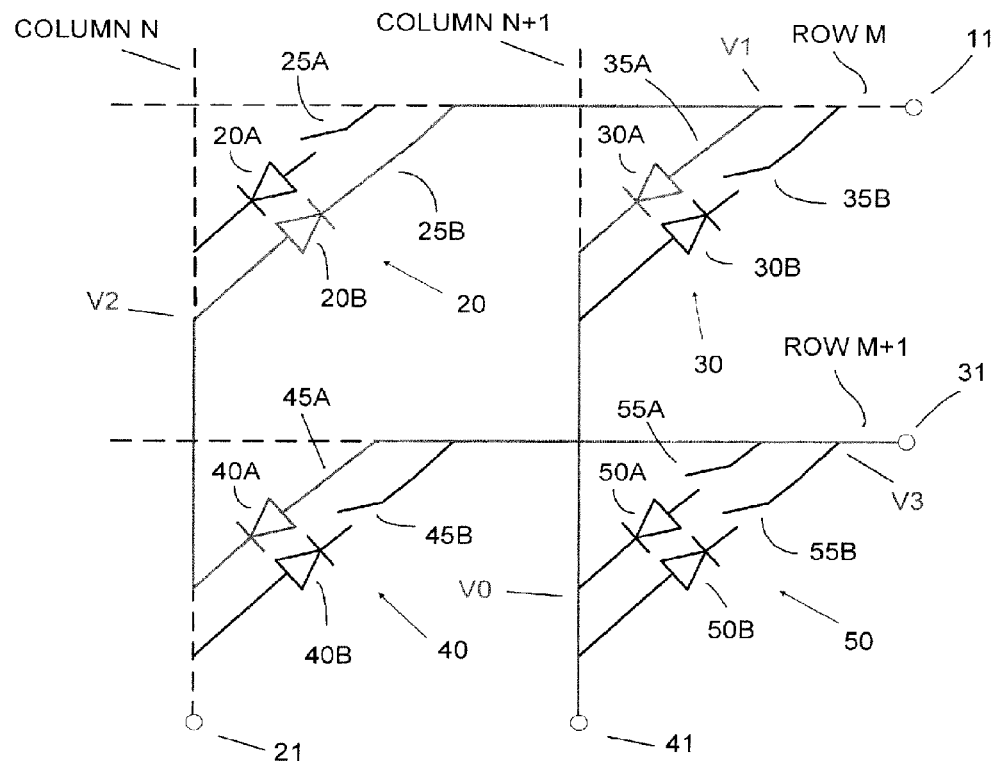
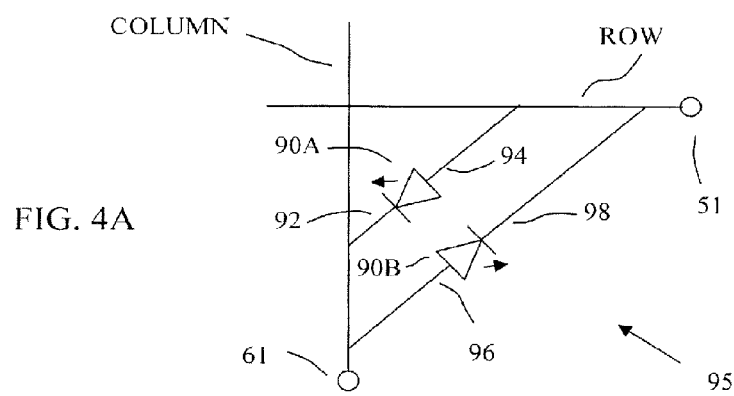
FIG. 4A

CIRCUIT FOR READING BUTTONS AND CONTROLLING LIGHT EMITTING DIODES

This application is a continuation of U.S. Non-Provisional application Ser. No. 11/616,779 filed Dec. 26, 2006, now U.S. Pat. No. 7,893,925, issued Feb. 22, 2011, which claims priority to U.S. Provisional Application No. 60/754,489 filed Dec. 27, 2005, both of which are incorporated herein by reference.

TECHNICAL FIELD

The present invention relates generally to electronic circuits and in particular circuits for human interface devices.

BACKGROUND

Microcontrollers (MCUs) are small, self-contained computers comprising a processing element, a program store, "scratch pad" memory and a number if input/output (I/O) pins. MCUs are very widely used in electronic products of all kinds, including computer peripherals (eg mice, keyboards, disk drives) consumer electronics (eg MP3 players, telephones, TV sets) and office equipment (eg photocopiers, fax machines)

Designers of microcontroller-based electronic devices frequently find that they need more I/O pins than their preferred microcontroller provides. Generally, the more input/output (I/O) pins an microcontroller has, the more it costs, and many of the lowest cost microcontroller are only offered in small packages with small numbers of I/O pins (for example up to sixteen I/O pins). In many microcontroller-based designs, the majority of the microcontroller I/O pins are used for reading the state of buttons, and for controlling light emitting diodes (LEDS). In one example application, there may be sixteen buttons and four LEDS. Using one I/O pin to read each button or control each LED would require twenty I/O pins. One conventional solution is to connect LEDS and buttons in a matrix, as shown in FIG. 1, in order to reduce the number of I/O pins.

FIG. 1 illustrates a conventional matrix of light emitting diodes and buttons comprised of four rows and five columns. Each of the rows and columns are associated with an I/O pin, such that there are a total of nine I/O pins. Four buttons are shown in each of the columns, COL 0, COL 1, COL 2 and COL 3, for a total of sixteen buttons. Four LEDS are shown in COL 4. A button 5 is shown connecting COL 1 with ROW 3, whereas an LED is shown connecting COL 4 with ROW 3.

In the conventional solution, the buttons are read by driving each row low (0V) in turn, and then reading the state of each column pin with a pull up resistor (not shown), COL 4 would be kept low during scanning to keep the scanning process from inadvertently lighting the LEDS. For example, to read button 5, ROW 3 is driven low and the COL 1 voltage is read with a pull up resistor.

The diodes are required in order to allow correct reading of all buttons with any combination of buttons to be pressed (otherwise "phantom keys" may be detected with certain combinations). The buttons are typically scanned periodically (e.g. every 100 ms) and scanning is generally fast (e.g. taking a total of 100 us). The remainder of the time, COL 4 is driven high, and the LEDS illuminated by driving the corresponding row pins low. In this conventional example the number of I/O pins required is reduced from twenty to nine by using this conventional method, at the cost of sixteen diodes. As diodes may cost as little as $0.001 each (one tenth of a US cent), this is often an acceptable cost to pay for the reduction in the number of I/O pins required.

FIG. 1A shows a single element of the conventional control matrix of FIG. 1. The button 5 connecting COL 1 with ROW 3 is shown as being connected in series with a diode 13. The cathode 9 of the diode 13 is shown connected to the button 5, whereas the anode 7 of the diode 13 is shown connected to COL 1. COL 1 and ROW 3 are each shown as including an I/O pin.

Disadvantages of conventional solution includes that it requires many I/O pins to read many buttons, and requires many I/O pins to control many LEDS, making it expensive and requiring the use of bigger microcontrollers.

The present invention addresses these and other problems associated with the prior art.

SUMMARY

An improved circuit is herein disclosed as including a first pin connection, a second pin connection, a first diode-switch arrangement and a second diode-switch arrangement. The first diode-switch arrangement is connected in series and configured to allow a current to pass from the second pin connection to the first pin connection. The second diode-switch arrangement is connected in series and configured to allow a current to pass from the first pin connection to the second pin connection. An energized state of the first and second diode-switch arrangements is determined according to a voltage detected on the first or second pin connection.

An improved apparatus is herein disclosed as including three connection pins, a first inverted diode pair having an anode-cathode orientation of a first diode opposite to that of the anode-cathode orientation of a second diode, the first inverted diode pair located between a first pin and a second pin. The apparatus further includes a second inverted diode pair located between the second pin and a third pin, and a third inverted diode pair located between the first and third pin. A current passing through the first or second diode of any of the first, second or third inverted diode pairs is determined by controlling the electrical states of the three connection pins.

A improved method is herein disclosed as including applying a low voltage, low impedance state to a first pin and pulling a second pin to a high impedance state, a pair of inversely polarized diodes being located between, and controlling, the flow of a current between the first and second pin. The method further includes reading the voltage on the second pin to determine if either of the diodes is passing the current through a switch connected in series with one of the diodes.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 4 illustrates an example embodiment of an improved matrix including the inverted diode pair of FIG. 3 or FIG. 3A.

FIG. 4A illustrates an example embodiment of a partial circuit including an inverted light emitting diode pair.

DETAILED DESCRIPTION

Figure 2:
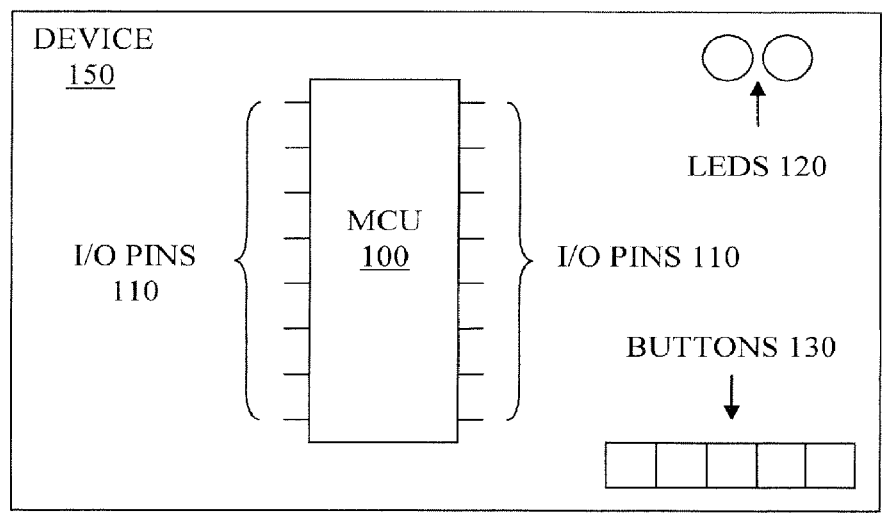
FIG. 2 illustrates an example embodiment of a simplified electronic device including a microcontroller.

FIG. 2 illustrates an example embodiment of a simplified electronic device 150 including a microcontroller (MCU) 100. The MCU 100 is shown as including multiple input/output (I/O) pins 110. The number of input/output pins may vary with different microcontrollers and embodiments, however the MCU 100 illustrated in FIG. 2 is shown as including sixteen pins as I/O pins 110. Device 150 is further illustrated as including a number of light emitting diodes (LEDS) 120 as well as a number of buttons 130. The device 150 including the MCU 100 may include logic or circuitry that interrelates the LEDS 120 with the buttons 130. More or fewer buttons and LEDS than displayed with the example device 150 are anticipated herein.

Figure 3:
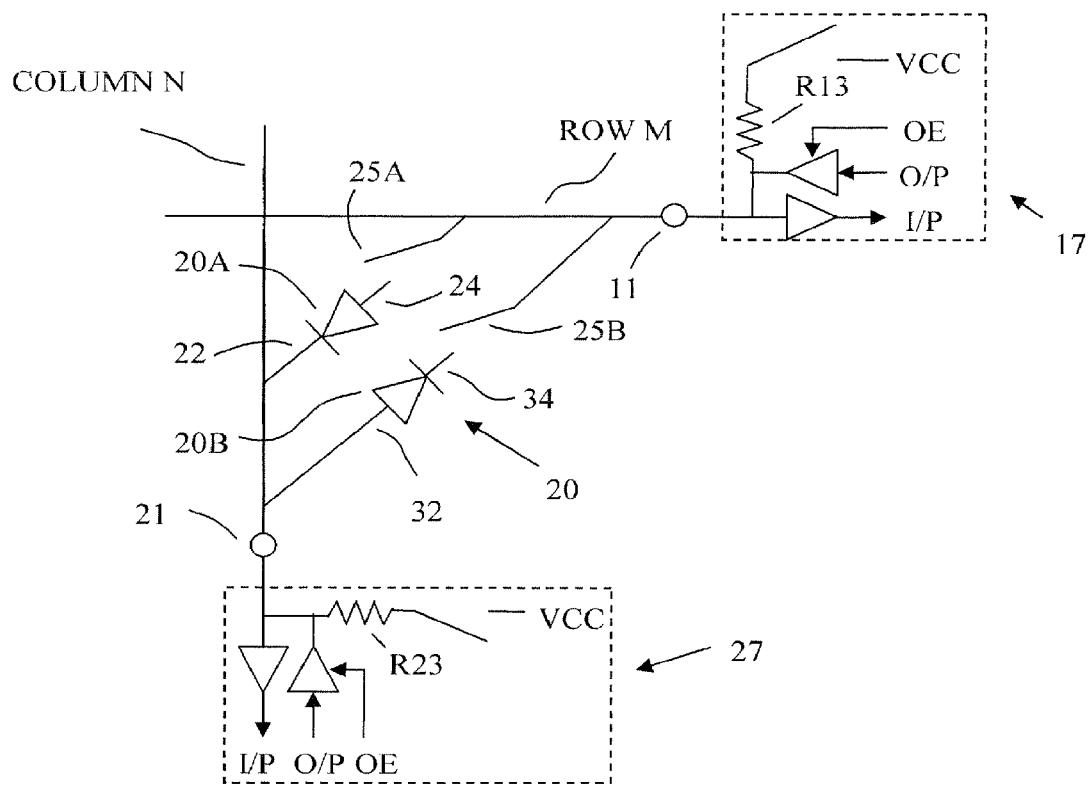
FIG. 3 illustrates an example embodiment of a partial circuit including an inverted diode pair.

In order to reduce the number of input/output pins, such as I/O pins 110, that are required to read buttons, such as buttons 130, and illuminate light emitting diodes, such as LEDS 120, a novel approach to circuit design and implementation is provided. FIG. 3 illustrates an example embodiment of a partial circuit including an inverted diode pair 20. The inverted diode pair 20 includes two diodes 20A and 20B. Diode 20A is connected in series with button 25A, whereas diode 20B is connected in series with button 25B. Where the word button is used, it is understood by one skilled in the art to be used interchangeably with a switch, and is not limited to any physical device that may otherwise be associated with a button. Rather button 25A and button 25B may associated with any control that provides an on/off functionality or that would complete the circuit between two I/O pins, such as pins 11 and 21 in FIG. 3

Diode 20A, which may be alternatively referred to herein as a first diode is shown connected to COLUMN N at a cathode end 22, whereas an anode end 24 of the diode 20A is shown connected to the button 25A. Diode 20B, which may be alternatively referred to herein as a second diode is shown connected to COLUMN N at an anode end 32, whereas a cathode end 34 of the diode 20B is shown connected to the button 25B. Button 25A and button 25B are shown connected to ROW M. In this manner, inverted diode pair 20 connect pin 11 of ROW M with pin 21 of COLUMN N.

The partial circuit shown in FIG. 3 therefore includes a first pin connection, such as pin 11, and a second pin connection, such as pin 21. The first diode 20A is connected in series with switch 25A in a first diode-switch arrangement to allow a current to pass from pin 11 to pin 21. The second diode 20B is connected in series with switch 25B in a second diode-switch arrangement to allow a current to pass from pin 21 to pin 11. As will be discussed further below, an energized state of the first and second diode-switch arrangements including switch 25A and switch 25B, respectively, may be determined according to a voltage detected on pin 11 or on pin 21.

Each of the I/O pins, such as pin 11 and pin 21 may be connected to a pull-up resistor, such as pull-up resistor R13 or R23, as well as an input buffer or output enable (OE), an output drive circuit (O/P) and an input line (I/P), identified together by state controls 17 and state control 27. Each of the I/O pins herein discussed may therefore include a state control such as state control 17 or state control 27. The pull-up resistors, such as resistors R13 and R23 are shown connected to a voltage source, such as a power supply voltage (Vcc). A voltage of the I/O pins 11, 21 may be read on the FP lines. The state controls and resistors control the voltage and impedance applied at the I/O pins as is known in the conventional art, and therefore is not discussed further herein.

Still with reference to FIG. 3, the diode cathode 22 of the first diode 20A and the diode anode 32 of the second diode 20B are shown connected to pin 21. Pin 11 may be pulled up to a power supply voltage (Vcc) by resistor R13 and a low voltage may be applied to pin 21 by state control 27. The energized state of the first diode-switch arrangement, including whether or not button 25A has been closed, may be determined according to a voltage measured on pin 11. For example, a low voltage measured on pin 11 would indicate that current is passing through the diode 20A and that button 25A is closed.

Pin 21 may be pulled up to a power supply voltage (Vcc) by resistor R23 and a low voltage may be applied to pin 11 by state control 27. The energized state of the second diode-switch arrangement, including whether or not button 25B has been closed, may be determined according to a voltage measured on pin 21. For example, a low voltage measured on pin 21 would indicate that current is passing through the diode 20B and that button 25B is closed. The energized state of the first diode-switch arrangement including diode 20A and the second diode-switch arrangement including diode 20B may be determined in any order according to which of the pins 11, 21 the low voltage is applied.

Figure 3A:
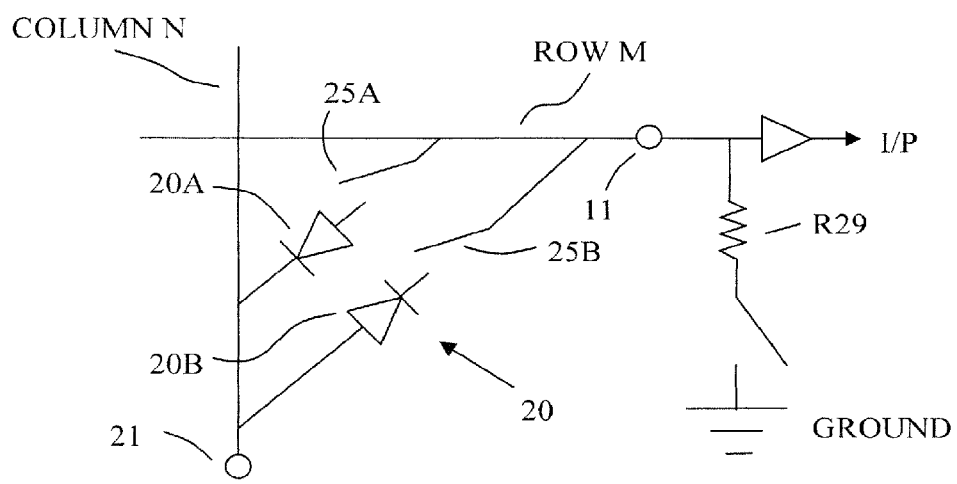
FIG. 3A illustrates an example embodiment of a partial circuit including an inverted diode pair utilizing a pull-down resistor.

FIG. 3A illustrates an example embodiment of a partial circuit including the inverted diode pair 20 utilizing a pull-down resistor 29. Each of the I/O pins 11, 21 may be configured to include a pull-down resistor, such as resistor R29 shown connected to ground. The pull-down resistor R29 may be included in a state control in place of a pull-up resistor.

In one embodiment, the energized state of the second diode-switch arrangement, including diode 20B, is determined by pulling pin 11 down to ground by a pull-down resistor R29, applying a high voltage to pin 21, and measuring a voltage on pin 21. The energized state of the diode-switch arrangements may therefore be determined by using a pull-up resistor as shown in FIG. 3 or a pull-down resistor as shown in FIG. 3A.

FIG. 4 illustrates an example embodiment of an improved matrix including the inverted diode pair 20 of FIG. 3 or FIG. 3A. Each of the rows and columns, including ROW M, ROW M+1, COLUMN N and COLUMN N+1, are associated with an I/O pin, such as pins 11, 21, 31 and 41. Each of the pins may be connected to a state control including a pull-up resistor or a pull-down resistor, as described above with reference to FIG. 3 and FIG. 3A.

In the improved matrix, two buttons (each associated with its own diode) are used at each intersection in the matrix. For example, at the intersection between COLUMN N and ROW M, the inverted diode pair 20 includes diodes 20A and 20B associated with buttons 25A, 25B. At the intersection between COLUMN N+1 and ROW M, the inverted diode pair 30 includes diodes 30A and 30B associated with buttons 35A, 35B. At the intersection between COLUMN N and ROW M+1, the inverted diode pair 40 includes diodes 40A and 40B associated with buttons 45A, 45B. Similarly, at the intersection between COLUMN N+1 and ROW M+1, the inverted diode pair 50 includes diodes 50A and 50B associated with buttons 55A, 55B.

Buttons 20A, 30A, 40A and 50A may be read by connecting ROW M and ROW M+1 to a pull-up resistor, such as pull-up resistor R13 in FIG. 3. In this case, a low voltage is applied to each column COLUMN N and COLUMN N+1 in turn, with an activated button causing a low voltage to be detected on its row when its column was scanned. For example, when a low voltage is applied to COLUMN N+1 at pin 41 and button 35A has been activated, a low voltage will be detected on ROW M at pin 11.

Buttons 20B, 30B, 40B and 50B may be read by connecting ROW M and ROW M+1 to a pull-down resistor, such as pull-down resistor R29 in FIG. 3A, and then applying a high voltage to each column COLUMN N and COLUMN N+1 in turn, with an activated button causing a high voltage to be detected on its row when its column was scanned. For example, when a high voltage is applied to COLUMN N at pin 21 and button 25B has been activated, a high voltage will be detected on ROW M at pin 11.

In certain configurations, there may be a practical limit on how high the "high voltage" may be. In order to prevent "phantom" buttons presses from being detected, for example from the pressing of three other buttons, the input threshold voltage of the rows may be limited to less than three times the voltage drop across the diodes. An example instance of possible phantom key aliasing is provided below with reference to FIG. 4.

In a 5V system, the input threshold of an I/O pin is typically around 2.5V, and the forward drop of a typical silicon diode is around 0.7V. Therefore, if buttons 25B, 35A and 45A are all pressed, the voltage drop V1 across diode 30A would be equal to 0.7V, the voltage drop V2 across diode 20B would be 1.4V, accumulative, and the voltage drop V3 across diode 40A would be 2.1V, accumulative. Three times the voltage drop across the diodes would therefore suggest an input threshold voltage limit of 2.1V. As the input threshold of 2.5V is greater than the input threshold voltage limit of 2.1V, this system may experience phantom key aliasing, in which it may incorrectly be determined that button 50A has been pressed, even though button 50A is in fact open. One solution to this problem is to use a 3.3V system, where the input threshold of an I/O pin would be approximately 1.5V, which is comfortably less than the input threshold voltage limit of 2.1V. This would minimize or remove the possibility of any phantom key detection.

Some microcontrollers have low input threshold voltages, rather than mid-rail input thresholds. For example, some 5V microcontrollers have a transistor-transistor logic (TTL) input mode in which the maximum voltage which will be detected as a "0", or LOW is 0.8V. In this case, the scanning of buttons 20B, 30B, 40B and 50B may be reversed, so that buttons 20B, 30B, 40B and 50B may be read by connecting COLUMN N and COLUMN N+1 to a pull-up resistor, such as pull-up resistor R13 in FIG. 3. In this case, a low voltage is applied to each row ROW M and ROW M+1 in turn, with an activated button causing a low voltage to be detected on its column when its row was scanned. For example, when a low voltage is applied to ROW M at pin 11 and button 25B has been activated, a low voltage will be detected on COLUMN N at pin 21.

Instead of reading buttons, embodiments such as the circuits illustrated in FIG. 3 and FIG. 4 may also be used for controlling LEDS. FIG. 4A illustrates an inverted pair of LEDS 95 including LED 90A and LED 90B. The inverted pair of LEDS 95 may be controlled at a single point in the matrix, for example at the intersection of a row and column, where the LEDS 90A and 90B are connected between a row and a column with opposing polarities. For example, the anode 94 of LED 90A is shown connected to the ROW, or pin 51, and the cathode 92 of LED 90A is shown connected to the COLUMN, or pin 61. The anode 96 of LED 90B is shown connected to the COLUMN, or pin 61, and the cathode 98 of LED 90B is shown connected to the ROW, or pin 51.

Figure 1:
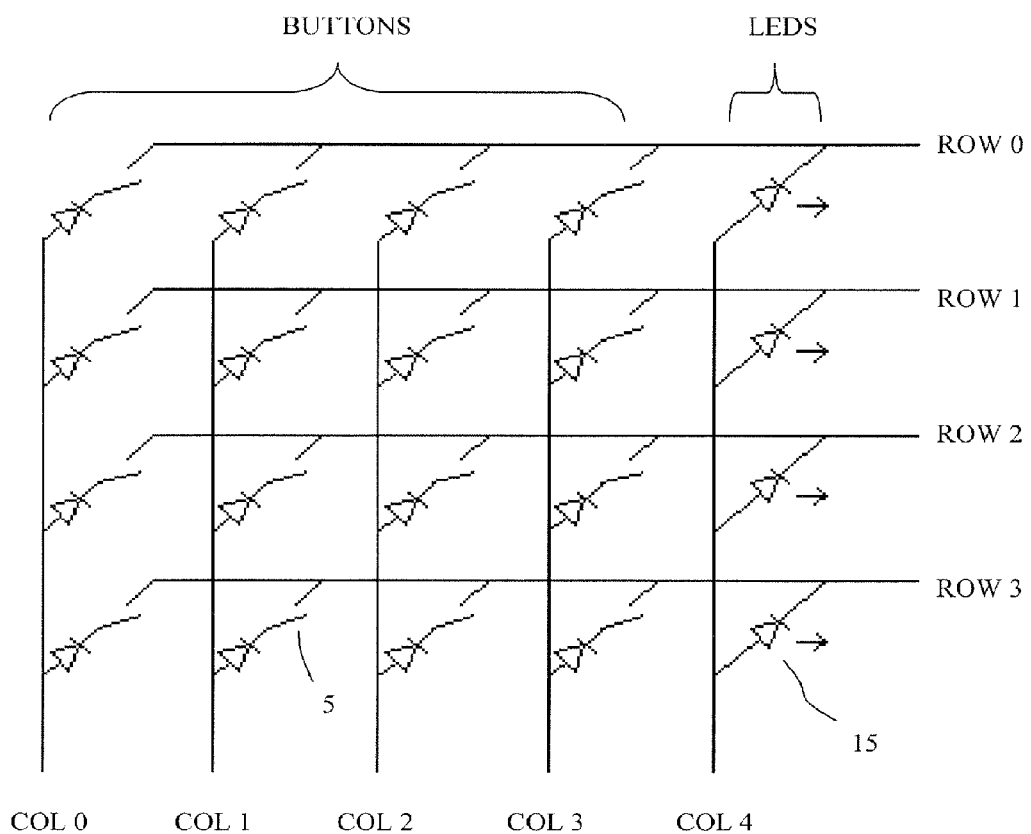
FIG. 1 illustrates a conventional matrix of light emitting diodes and buttons.
Figure 1A:
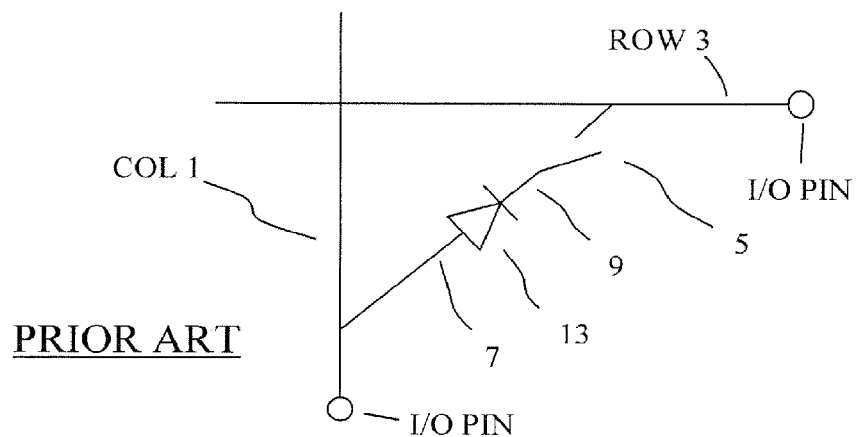
FIG. 1A illustrates a single element of a conventional matrix.

In the conventional solution matrix shown in FIG. 1, the LED control column COL 4 is held high whenever the matrix is not being scanned, and the LEDS, such as LED 15 are illuminated by holding the corresponding row line low, for example ROW 3 associated with LED 15. In the improved circuit shown in FIG. 4A, the COLUMN would alternate between high and low voltages, with a frequency high enough to not be visible to the human eye (for example approximately 500 Hz or more). To light LED 90A, the ROW is held at a high voltage while the COLUMN is in a low voltage state. To light LED 90B, the ROW is held at a low voltage while the COLUMN is in a high voltage state. One skilled in the art could therefore replace some or all of the diode-switch arrangements shown in the circuit of FIG. 4 with inverted pairs of LED's, such as LED 90A and LED 90B, to control the illumination of the LEDS and/or reading buttons in the same circuit.

Controlling the frequency of the circuit may impose a small firmware burden as the microcontroller changes the states of the ROW and COLUMN lines periodically (in one embodiment once every 1 ms). However, many firmware designers use a 1 ms microcontroller interrupt to control timing and sequencing, in which case the firmware to change the states of these lines could be executed as part of such a 1 ms timer Interrupt Service Routine (ISR).

Figure 5:
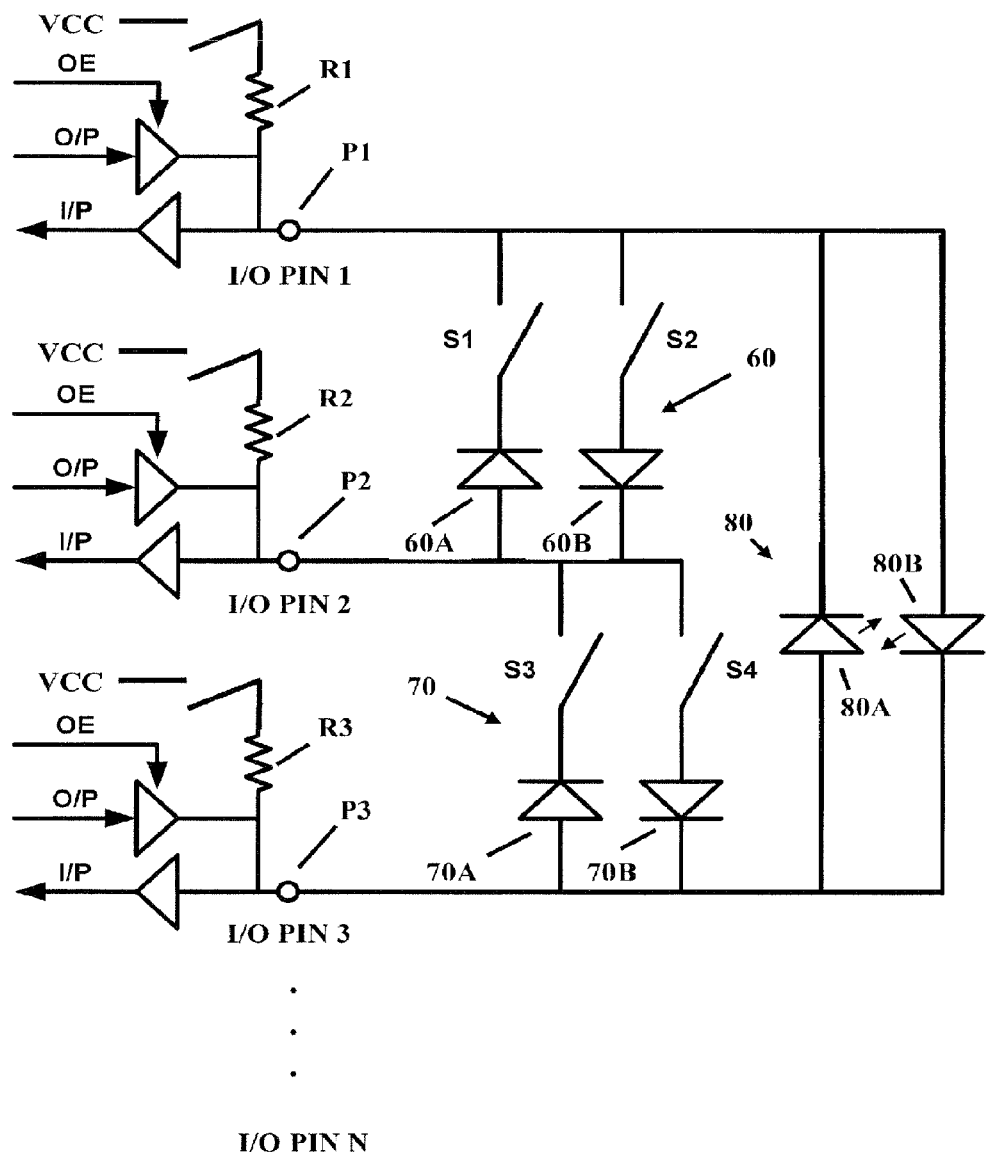
FIG. 5 illustrates an example embodiment of a circuit including multiple inverted diode pairs.

FIG. 5 illustrates an example embodiment of a circuit including multiple inverted diode pairs 60, 70 and 80, and three connection pins P1, P2 and P3. Pins P1, P2 and P3 are shown as being connected to pull-up resistors R1, R2 and R3. Pull-up resistors R1, R2 and R3 may each be included in a state control such as state control 17 shown and discussed with reference to FIG. 3.

A first inverted diode pair 60 is shown as having an anode-cathode orientation of a first diode 60A opposite to that of the anode-cathode orientation of a second diode 60B. The first inverted diode pair 60 is shown as being located between a first pin P1 and a second pin P2. The first and second diodes 60A and 60B in the first inverted diode pair 60 are each connected in series to a switch S1 and S2, respectively.

A second inverted diode pair 70 is shown as having an anode-cathode orientation of a first diode 70A opposite to that of the anode-cathode orientation of a second diode 70B. The second inverted diode pair 70 is shown as being located between the second pin P2 and a third pin P3. The first and second diodes 70A and 70B in the second inverted diode pair 70 are each connected in series to a switch S3 and S4, respectively.

A third inverted diode pair 80 is shown as having an anode-cathode orientation of a first diode 80A opposite to that of the anode-cathode orientation of a second diode 80B. The third inverted diode pair 80 is shown as being located between the first pin P1 and the third pin P3. The first and second diodes 80A and 80B in the third inverted diode pair 80 are shown as being LEDS.

A current passing through any of the first diodes 60A, 70A or 80A or through any of the second diodes 60B, 70B or 80B of any of the inverted diode pairs 60, 70, 80 may be determined by controlling the electrical states of the three connection pins P1, P2, P3. The first diode 60A and the second diode 60B in the first inverted diode pair 60A are each connected in series to switches S1 and S2, respectively. An energized state of the first and second switches S1 and S2 may be determined or read by setting the third pin P3 to a high impedance state and alternately changing the state of the first and second pins P1 and P2. For example, switch S1 may be read by setting pin P1 to a low voltage, low impedance state and pulling pin. P2 to a high impedance state using pull-up resistor R2 and measuring the voltage of pin P2. Switch S2 may be read by setting pin P2 to a low voltage, low impedance state and pulling pin P1 to a high impedance state using pull-up resistor R1 and measuring the voltage of pin P1. In one embodiment, the high impedance state is obtained by using a pull-up resistor of approximately 5 k ohms.

The electrical states of the connection pins P1, P2 and P3 may be sequentially controlled to determine which of the diodes in each of the inverted diode pairs 60, 70, 80 pass current. In one embodiment, only one of the diodes 60A, 60B, 70A, 70B, 80A, 80B in the circuit passes current at any given time.

The first LED 80A and the second LED 80B in the inverted diode pair 80 are may be energized, or illuminated, by setting pin P2 to a high impedance state and alternately changing the state of P1 and P3 to a low voltage state. For example, LED 80A may be energized by pulling up pin P3 to the voltage source Vcc using pull-up resistor R3 and setting pin P1 to a low voltage. LED 80B may be energized by pulling up pin P1 to the voltage source Vcc using pull-up resistor R1 and setting pin P3 to a low voltage.

LED 80A and LED 80B may be energized in sequence, for example, using a duty cycle of less than one, where only one of the LEDS is energized at any given time. In one embodiment, regardless of the number of LEDS present in the circuit, only one LED is energized at any given time. In one embodiment, a frequency of the duty cycle may be increased such that more than one of the LEDS appears to be illuminated at the same time to a human eye.

One embodiment may utilize a relatively lower operating voltage than conventional circuits. For example, the logic state detected on an input pin in PU mode may be a "0", or LOW, if the pin is connected to ground through a single diode, whereas the logic state may be detected as a "1", or HIGH, if the pin is connected to ground through just two diodes connected in series. This may be expressed by the following two equations:

$$Vil(max) > Vf \quad \text{Equation 1}$$

$$Vih(min) < 2*Vf \quad \text{Equation 2}$$

Vil(max) is the maximum pin threshold voltage for input low, Vih(min) is the minimum pin threshold voltage for high input, and Vf is the forward voltage drop across a diode. In low voltage systems, for example, where Vcc=1.8V, Vf=0.7V, Vih(min)=0.6*Vcc and Vil(max)=0.40*Vcc. In this case, Vil(max) equals 0.72V, which is greater than Vf, and Vih(min) equals 1.08V which is less than 2*Vf, thereby satisfying Equations 1 and 2. A microcontroller powered from any voltage may be used if the I/O pins have a "TTL" mode, in which the maximum voltage that may be detected as a "0", or LOW, is 0.8V or less.

An improved circuit including three I/O pins, such as illustrated in of FIG. 5, may be used to read six buttons, four buttons and two LED, two buttons and four LEDS, or six LEDS. Additionally, one or more of the inverted diode pairs could be designed so as to include one button and one LED having oppositely oriented anodes and cathodes.

In one embodiment, each I/O pin P1, P2 and P3 has four possible states; namely High Impedance (HiZ), pulled up to Vcc through a resistor (PU), driven to Vcc (HIGH), and driven to 0V (LOW). This improved circuit may be used to detect or control the state of all six buttons and/or LEDS, regardless of the combinations of states of the buttons or LEDS.

By way of illustration making reference to the example circuit shown in FIG. 5, the state of the diodes and LEDS may be detected and controlled according to the following sequence of operations:

Pin P3 is set to HiZ
Pin P2 is set to PU
Pin P1 is set to LOW
The state of button S1 is read on pin P2
Pin P2 is set to HiZ
Pin P3 is set to HIGH
LED 80A is energized
Pin P1 is set to FEZ
Pin P2 is set to LOW
The state of button S3 is read on pin P3
Pin P3 is set to HiZ
Pin P1 is set to PU
The state of button S2 is read on pin P1
Pin P2 is set to HiZ
Pin P3 is set to LOW
Pin P1 is set to HIGH
LED 80B is energized
Pin P1 is set to HiZ
Pin P2 is set to PU
Pin P3 is set to LOW
The state of button S4 is read on pin P2

The above sequence is by way of illustration only, and is not a required or limiting sequence of operation to read the buttons and LEDS. The buttons and LEDS may instead be read or controlled in a different sequence than described above, including omitting reading or controlling any of the diodes or LEDS.

The inverted switch-diode arrangements in FIG. 5 may be replaced by LEDS, and a reading step in the method is eliminated and replaced with an LED being energized or illuminated. If an LED is to be left "off", then the corresponding steps for that diode may simply be omitted. The pullup (or bias) resistor on each I/O pin may be connected to a voltage greater than the forward voltage of the LED (typically around 2.0V) but less than double the forward voltage in order to avoid inadvertently energizing or illuminating a second LED in series with a first LED.

The LEDS in an improved circuit may be driven with a duty cycle of less than one, such that the LEDS are not energized or held on continuously. LEDS typically have maximum peak currents much higher than the maximum allowed continuous current, and in some LEDS, the intensity of the light emitted increases with current, but at a greater rate than the rate of increase in current. So, for example, driving a certain LED with 20 mA may result in more than doubling the light output compared with driving it at 10 mA. Because of human persistence of vision, such an LED driven with a 50% duty cycle at 20 mA will appear brighter than the same LED driven continuously at 10 mA. Therefore, the same LED appears brighter, despite using the same amount of power.

Whereas the pins P1, P2 and P3 are shown as being connected to pull-up resistors RE R2 and R3 respectively, one or more of the resistors R1, R2 or R3 could be replace by pull-down resistors such as R29 illustrated in FIG. 3A. A method of reading buttons or controlling LEDS may be different where one or more of the pins are connected to pull-down resistors, as previously described. Although the circuit shown in FIG. 5 includes two inverted diode pairs 60 and 70, and one pair of inverted LEDS 80, the circuit could be provided with different combinations of buttons and LEDS. For example, the circuit could instead include three pairs of inverted LEDS, two pairs of inverted LEDS and one pair of inverted diode-switch arrangements, or three pairs of inverted diode-switch arrangements. Additionally, more than three I/O pins, identified as I/O PIN N, could be included in the circuit in order to accommodate additional inverted diode-switch arrangements or inverted LEDS.

Figure 6:
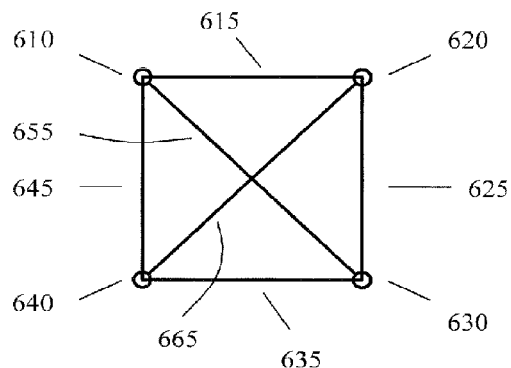
FIG. 6 illustrates an example abstract topology of an embodiment including four connection pins.

FIG. 6 illustrates an example abstract topology of an embodiment including four connection pins arranged to form a polygon. Each of the four vertices in the polygon represent a connection pin, whereas each of the lines connecting the vertices represent a diode pair of LEDS and/or buttons. In one embodiment, the number of buttons that may be read by a circuit comprised of four connection pins is twelve, compared to four buttons in a conventional circuit.

Figure 7:
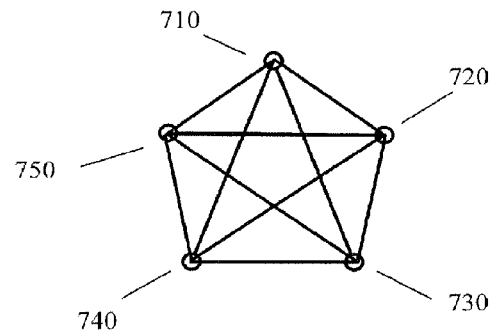
FIG. 7 illustrates an example abstract topology of an embodiment including five connection pins.

FIG. 7 illustrates an example abstract topology of an embodiment including five connection pins. Each of the five vertices in the polygon represent a connection pin, whereas each of the lines connecting the vertices represent a diode pair of LEDS and/or buttons. In one embodiment, the number of buttons that may be read by a circuit comprised of five connection pins is twenty, compared to six buttons in a conventional circuit.

Figure 8:
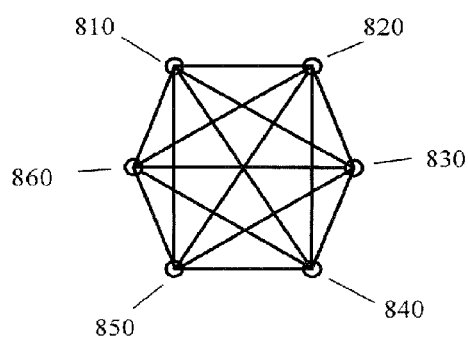
FIG. 8 illustrates an example abstract topology of an embodiment including six connection pins.

FIG. 8 illustrates an example abstract topology of an embodiment including six connection pins. Each of the six vertices in the polygon represent a connection pin, whereas each of the lines connecting the vertices represent a diode pair of LEDS and/or buttons. In one embodiment, the number of buttons that may be read by a circuit comprised of six connection pins is thirty, compared to nine buttons in a conventional circuit.

One skilled in the art would understand that the topologies shown in FIGS. 6, 7 and 8 do not show logical connections between pins, but rather they illustrate a conceptual model for expressing the number of interconnections between all of the I/O pins and the associated number of buttons and/or LEDS that may be read or controlled by the pins. Accordingly, it is understood that the number of buttons that may be read, or number of LEDS that may be controlled, by an improved circuit may be expressed as 2*sum (0 to n−1) where n is the number of I/O pins. For example, a circuit that includes seven I/O pins would be able to read 2*(0+1+2+3+4+5+6) or forty two buttons, compared to twelve buttons in a conventional circuit. The number of buttons or LEDS that may be read or controlled in the improved circuit may also be expressed as n*(n−1). For example, an improved circuit that includes sixteen I/O pins would be able to read 16*15 or 240 buttons, compared to sixty four buttons in a conventional system having the same number of sixteen I/O pins.

The improved circuit is therefore able to drive large arrays of LEDS with many fewer I/O pins than a conventional circuit, such as the circuit shown in FIG. 1, and may therefore be particularly useful in large dot matrix or 7-segment LED display applications. The improved circuit reduces the number of I/O pins used to read a given number of buttons and reduces the number of I/O pins required to read a given number of buttons. The improved circuit further increases the number of buttons which may be read by given number of I/O pins and increases the number of LEDS which may be controlled by given number of I/O pins.

Figure 9:
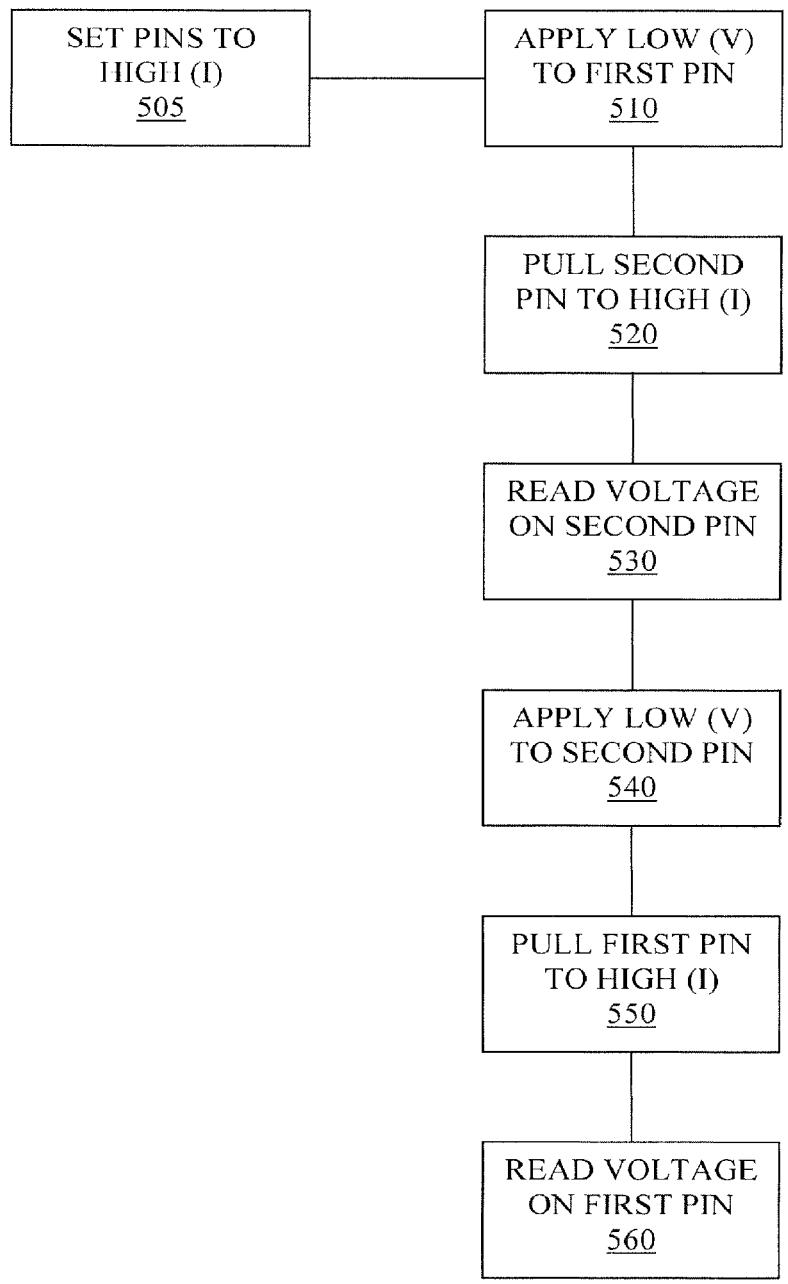
FIG. 9 illustrates an example block diagram illustrating a method of implementation of a circuit including inverted diode pairs.

FIG. 9 illustrates an example block diagram illustrating a method of implementation of a circuit including inverted diode pairs, such as the inverted diode pair 20 shown in FIG. 3. Although, the same or similar method may be applied to an inverted diode pair shown in FIG. 5 for example.

At operation 510 a low voltage, low impedance state is applied to a first pin, such as pin 11. The low voltage, low impedance state may be applied by a state control such as state control 17 shown in FIG. 3.

At operation 520 a second pin, such as pin 21 is pulled to a high impedance state. A pair of inversely polarized diodes such as inverted diode pair 20 of FIG. 3 may be located between, and control the flow of a current between, the first pin and a second pins.

At operation 505, all other pins in the circuit, if any, may be set to a high-impedance, no voltage state. For example, the third pin P3 in FIG. 5 may be set to a high-impedance state when reading or controlling inverted diode pair 60.

At operation 530 the voltage on the second pin is read to determine if either of the diodes, such as diodes 20A or 20B, in the inverted diode pair is passing the current through a switch, such as switch 25A or 25B shown in FIG. 3, which is connected in series with one of the diodes. In one embodiment the switch, such as switch 25A is connected in series to one of the diodes, such as diode 20A, having a cathode end 22 connected to the second pin.

At operation 540 a low voltage, low impedance state is applied to the second pin, such as pin 21 of FIG. 3. The low voltage, low impedance state may be applied by a state control such as state control 27.

At operation 550 the first pin such as pin 11 of FIG. 3 is pulled to a high impedance state.

At operation 560 the voltage on the first pin, such as pin 11, is read to determine if current is passing through one of the diodes, such as diode 20B, having an anode end 32 connected to the second pin.

In one embodiment the first pin, such as pin 11, is connected to a circuit matrix row such as ROW M and the second pin, such as pin 21, is connected to a circuit matrix column such as COLUMN N. In another embodiment, the first and second pins are configured similarly as shown in. FIG. 5 with respect to a combination of any two of the pins P1, P2, P3 where the circuit is not designed as a matrix with rows and columns.

Embodiments described herein may operate with microprocessors using CMOS, TTL and other types of semiconductors and circuits. The low and high impedance states described with reference to the improved circuits and methods may be provided by one or more pull-up resistors and pull-down resistors.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An apparatus comprising:
a first inverted diode pair having an anode-cathode orientation of a first diode opposite to that of the anode-cathode orientation of a second diode, the first inverted diode pair located between a first pin and a second pin;
a second inverted diode pair located between the second pin and a third pin; and
a third inverted diode pair located between the first pin and the third pin;
wherein the first inverted diode pair, the second inverted diode pair, and the third inverted diode pair are each separate from each other;
wherein the electrical states of the first pin, the second pin, and the third pin are configured to determine if current is passing through the first diode or the second diode of any of the first, the second or the third inverted diode pairs.

2. The apparatus of claim 1 where the first and second diodes in the first inverted diode pair are each connected in series to a switch which is read by setting the third pin to a high impedance state and alternately changing the state of the first and second pins by setting one of them to a low voltage, low impedance state and pulling the other to a high impedance state and measuring the voltage of the pin in the high impedance state.

3. The apparatus of claim 1 where the first and second diodes in the first inverted diode pair are light emitting diodes that are energized by setting the third pin to a high impedance state and alternately changing the state of the first and second pins to a low voltage state.

4. The apparatus of claim 3 where more than one of the light emitting diodes appear to be illuminated at the same time by increasing a frequency of the duty cycle higher than visible to a human eye.

5. The apparatus of claim 1 where the electrical states of the connection pins are sequentially controlled to determine which of the first and second diodes in each of the inverted diode pairs pass current.

6. The apparatus of claim 5 where only one of the first and second diodes pass current at any given time.

7. A method comprising:
applying a low voltage state to a first pin, wherein a first inverted diode pair is coupled between the first pin and a second pin, the first inverted diode pair including an anode-cathode orientation of a first diode opposite to that of the anode-cathode orientation of a second diode;
applying a high impedance state to a third pin, wherein a second inverted diode pair is coupled between the second pin and the third pin, wherein a third inverted diode pair is coupled between the third pin and the first pin, and wherein the first inverted diode pair, the second inverted diode pair, and the third inverted diode pair are each separate from each other;
pulling the second pin to a high voltage state to control the flow of a current between the first pin and the second pin through the first inverted diode pair; and
reading the voltage on the second pin to determine if the first diode or the second diode of the first inverted diode pair is passing the current.

8. The method of claim 7, further comprising:
after the reading the voltage on the second pin, applying a low voltage state to the second pin;
applying a high impedance state to the first pin;
pulling the third pin to a high voltage state; and
reading the voltage on the third pin to determine if current is passing through one of the diodes of the second inverted diode pair that is coupled to the third pin.

9. The method of claim 7, further comprising:
after the reading the voltage on the second pin, applying a high impedance state to the second pin;
applying a low voltage state to the third pin;
pulling the first pin to a high voltage state; and
reading the voltage on the first pin to determine if current is passing through one of the diodes of the third inverted diode pair that is coupled to the first pin.

10. The method of claim 7, wherein the low voltage state and the high voltage state are provided based on one or more pull-up resistors.

11. The method of claim 7, wherein the low voltage state and the high voltage state are provided based on one or more pull-down resistors.

12. The method of claim 7, wherein the first pin is connected to a circuit matrix row and the second pin is included in a circuit matrix column.

* * * * *